(12) United States Patent
Liu et al.

(10) Patent No.: US 6,838,347 B1
(45) Date of Patent: Jan. 4, 2005

(54) METHOD FOR REDUCING LINE EDGE ROUGHNESS OF OXIDE MATERIAL USING CHEMICAL OXIDE REMOVAL

(75) Inventors: Joyce C. Liu, Carmel, NY (US); Wesley C. Natzle, New Paltz, NY (US); Richard S. Wise, New Windsor, NY (US); Hongwen Yan, Somers, NY (US); Bidan Zhang, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,331

(22) Filed: Sep. 23, 2003

(51) Int. Cl.[7] .................. H01L 21/336; H01L 21/3205; H01L 21/4763
(52) U.S. Cl. ...................... 438/291; 438/303; 438/305; 438/585
(58) Field of Search ............................... 438/283, 291, 438/303, 305, 585, 586, 645, 666, 733

(56) References Cited

U.S. PATENT DOCUMENTS

| | | | | |
|---|---|---|---|---|
| 6,174,818 B1 * | 1/2001 | Tao et al. | ................... | 438/733 |
| 6,258,679 B1 * | 7/2001 | Burns et al. | ................ | 438/303 |
| 6,353,249 B1 * | 3/2002 | Boyd et al. | ................. | 257/369 |
| 6,516,528 B1 * | 2/2003 | Choo et al. | ................. | 148/33.2 |
| 6,582,891 B1 * | 6/2003 | Hallock et al. | ............. | 430/330 |
| 6,583,469 B1 * | 6/2003 | Fried et al. | ................. | 438/283 |
| 6,620,715 B1 * | 9/2003 | Blosse et al. | ............... | 438/585 |
| 6,660,598 B2 * | 12/2003 | Hanafi et al. | ............... | 438/291 |
| 6,682,996 B1 * | 1/2004 | Blosse | ........................ | 438/586 |
| 6,686,630 B2 * | 2/2004 | Hanafi et al. | ............... | 438/283 |
| 6,737,325 B1 * | 5/2004 | Mehrotra et al. | ........... | 438/305 |
| 6,764,946 B1 * | 7/2004 | Amblard | ..................... | 438/637 |
| 6,764,947 B1 * | 7/2004 | Chan et al. | ................. | 438/645 |
| 6,764,949 B2 * | 7/2004 | Bonser et al. | .............. | 438/666 |
| 6,767,824 B2 * | 7/2004 | Nallan et al. | ............... | 438/633 |
| 2003/0049571 A1 | 3/2003 | Hallock et al. | ............. | 430/330 |

* cited by examiner

Primary Examiner—John F. Niebling
Assistant Examiner—Walter L. Lindsay, Jr.
(74) Attorney, Agent, or Firm—James J. Cioffi; Cantor Colburn LLP

(57) ABSTRACT

A method for reducing line edge roughness (LER) of a semiconductor gate structure includes patterning a photoresist layer formed over an oxide hardmask layer. The photoresist layer is etched so as to transfer a photoresist pattern to the oxide hardmask layer, the photoresist pattern having an initial LER. The exposed surfaces of the oxide hardmask are etched with a chemical oxide removal (COR) so as to form a reaction product on the exposed surfaces, wherein concave portions of the exposed surfaces are etched at a reduced rate with respect to convex portions of the exposed surfaces.

12 Claims, 7 Drawing Sheets

METHOD FOR REDUCING LINE EDGE ROUGHNESS OF OXIDE MATERIAL USING CHEMICAL OXIDE REMOVAL

BACKGROUND OF INVENTION

The present invention relates generally to semiconductor device processing and, more particularly, to a method for reducing line edge roughness of oxide material using chemical oxide removal.

In the semiconductor industry, there is a continuing trend toward higher device densities by scaling down the device dimensions on semiconductor wafers (e.g., at submicron levels). In order to accomplish such high device packing density, smaller and smaller feature sizes are required. These feature sizes may include, for example, the width and spacing of interconnecting lines, spacing and diameter of contact holes, and the surface geometry such as corners and edges of various device structures.

The need for implementing small features with close spacing between adjacent features requires high-resolution photolithographic processes. Generally speaking, lithography refers to processes for pattern transfer between various media. More specifically, lithography is a technique used for integrated circuit fabrication in which a silicon slice (i.e., the wafer) is coated uniformly with a radiation-sensitive film (the resist). Then, an exposing source (such as optical light, x-rays, for example) illuminates selected areas of the surface through an intervening master template (i.e., the mask) for a particular pattern. Exposure of the coating through such a photomask causes the image area to become either more or less soluble (depending on the coating) in a particular solvent developer. The more soluble areas are removed in the developing process to leave the pattern image in the coating as less soluble polymer.

The goal of a high performance lithography system is to provide a high resolution, repeatable system that reduces the linewidth of the features produced thereby. In addition to providing small, repeatable linewidths, it is also desirable to provide linewidth uniformity across the image field. In other words, it is desirable to provide a lithography system in which a designer can expect the linewidth of various features across the image field to fall within a predetermined range of a nominal, target value.

Unfortunately, as feature linewidths and the average linewidth variations associated with features continue to shrink, distinguishing the average linewidth variations that are due to the lithography system from the linewidth variations due to other phenomena becomes increasingly difficult. One such phenomenon is what is known in the art as "line edge roughness" (LER), which refers to the irregularities or deviations from the mean at the edge of the line and at the sidewalls of patterned features.

LER occurring in patterned features may be caused, for example, by a corresponding LER within an overlying photoresist, which is used as a mask for the patterning of the features. LER in photoresist masks may also caused by various factors such as, for example, LER on the chrome patterns which reside on the reticle (often called mask edge roughness), the image contrast of the system used in generating the photomask pattern, the plasma etch with which the photoresist pattern is formed, the photoresist material properties and chemistry and the photoresist processing scheme. Regardless of the specific cause(s) of the LER in the lithography process, the LER is subsequently transferred into the underlying film (e.g., metal, polysilicon, etc.). In addition to the original LER in the photoresist mask, the plasma etch used in subsequently patterning the underlying film further contributes to the LER of the patterned feature.

It will thus be appreciated that LER can impact the process control, for example, during gate patterning of a VLSI device. As the linewidth is scaled down in the semiconductor device, any line edge roughness (LER) introduced during gate patterning contributes more and more to the off-state leakage budget and short channel effect control. Accordingly, it is desirable to be able to reduce the LER of a resulting structure, such as a polysilicon gate line. Moreover, if the LER could be reduced without necessarily having to employ stricter lithographic processes, further benefits (such as higher speed devices) would result.

SUMMARY OF INVENTION

The foregoing discussed drawbacks and deficiencies of the prior art are overcome or alleviated by a method for reducing line edge roughness (LER) of a semiconductor gate structure. In an exemplary embodiment, the method includes patterning a photoresist layer formed over an oxide hardmask layer. The photoresist layer is etched so as to transfer a photoresist pattern to the oxide hardmask layer, the photoresist pattern having an initial LER. The exposed surfaces of the oxide hardmask are etched with a chemical oxide removal (COR) so as to form a reaction product on the exposed surfaces, wherein concave portions of the exposed surfaces are etched at a reduced rate with respect to convex portions of the exposed surfaces.

In another aspect, a method for forming a gate structure for a semiconductor device includes patterning a photoresist layer formed over an oxide hardmask layer, the oxide hardmask layer formed over a gate conductor layer. The photoresist layer is etched so as to transfer a photoresist pattern to the oxide hardmask layer. An initial line edge roughness (LER) of the oxide hardmask layer is then reduced, and the gate structure is etched using the oxide hardmask layer, wherein the reduced initial LER is transferred to the gate structure.

In still another aspect, a method for reducing line edge roughness of an oxide structure includes etching exposed surfaces of the oxide structure with a chemical oxide removal (COR), wherein the COR is implemented by reacting the oxide material with HF and ammonia gasses so as to form a reaction product on the exposed surfaces. Concave portions of the exposed surfaces are etched at a reduced rate with respect to convex portions of the exposed surfaces.

BRIEF DESCRIPTION OF DRAWINGS

Referring to the exemplary drawings wherein like elements are numbered alike in the several Figures.

DETAILED DESCRIPTION

As indicated above, when the linewidth is scaled down in VLSI devices, any line edge roughness (LER) introduced during gate patterning contributes more and more to the off-state leakage budget and short channel effect control. Traditionally, the lithography community has focused significant effort in studying, modeling and reducing LER at the resist level. In contrast, disclosed herein is a novel method (carried out at the etching level) for reducing LER of an oxide line that is used as a hardmask for poly gate formation. This approach to reduction of LER enables the use of more aggressive (and typically rougher) lithographic processes, thereby enabling higher speed devices.

As is known in the art, one particular integration scheme for gate patterning is to use an oxide layer as hardmask for subsequent poly gate etching. Conventionally, during the oxide hardmask etching step, any LER present on the resist pattern will transfer down to the oxide pattern. In turn, the resulting roughness in the oxide pattern is then transferred into the poly gate material during gate RIE, since the oxide pattern is used as a mask for the gate etching step. It therefore follows that if the transferred roughness in the oxide mask could be smoothed prior to the gate etching step, then the LER would be prevented from being transferred into the underlying gate material.

Accordingly, an embodiment of the present disclosure is implemented to smooth the oxide mask itself by etching with hydrofluoric (HF) and ammonia gasses in a process known as a COR (Chemical Oxide Removal). Briefly stated, the COR process is a two step process in which the reaction of HF and ammonia with silicon dioxide produces a solid reaction product (ammonium hexafluorosilicate). The solid reaction product occupies more volume than the originally reacted oxide, and also forms a diffusion barrier toward the HF and ammonia reaction. As the reaction proceeds, the thickness of the reaction product increases, thereby impeding access of HF and ammonia to the reacting silicon dioxide surface. The rate of reaction slows and is eventually self-limiting as the reaction product forms.

Figure 1:
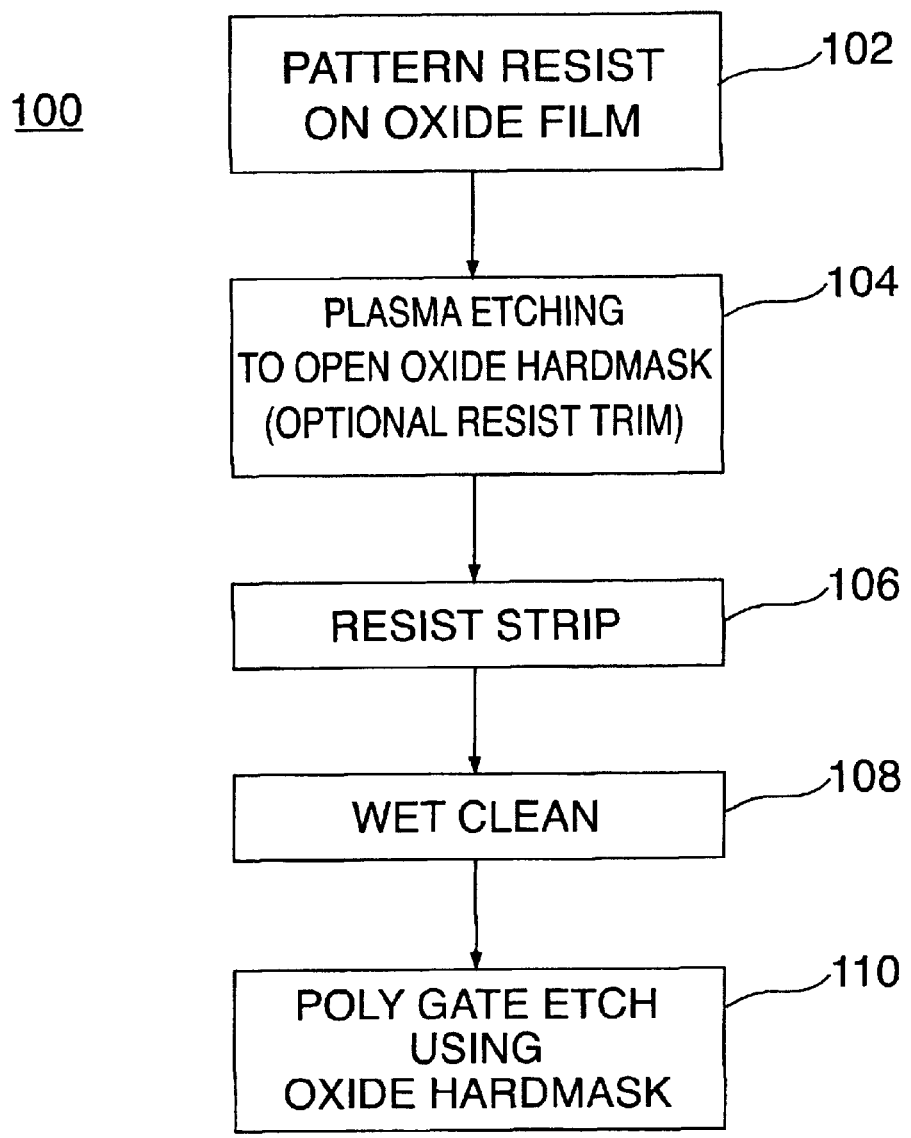
FIG. 1 is a schematic block diagram of an existing poly gate line formation process.
Figure 2:
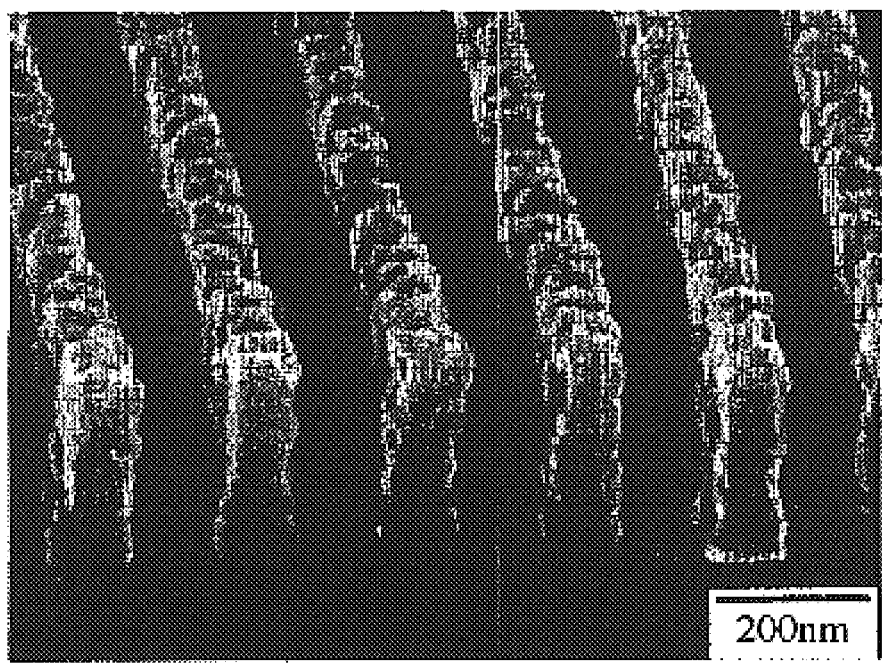
FIG. 2 is a scanning electron micrograph (SEM) illustrating an extreme example of line edge roughness of a conventionally formed photoresist pattern.

FIG. 1 is a schematic block diagram of an existing poly gate line formation process 100, in which a layer of photoresist material formed over an oxide antireflective coating (ARC)/hardmask film is patterned, as described in block 102. At block 104, a plasma etching step is used to open the oxide hardmask (e.g., a tetraethyl orthosilicate (TEOS) layer). At this point, any optional resist trimming steps to reduce the critical dimension may also be performed. After the hardmask lines are formed, the resist is then stripped (block 106), and a wet clean step is implemented at block 108 in order to remove any dry etching byproducts. Then, as shown at block 110, the polysilicon gate line etching step of the gate conductor material is carried out, using the patterned hardmask. However, as mentioned previously, any LER introduced in the resist patterning step is subsequently introduced into the oxide hardmask, and thereafter into the poly gate conductor material itself. FIG. 2 depicts, for example, a scanning electron micrograph (SEM) illustrating the line edge roughness of a conventionally formed photoresist pattern that will translate through to the gate patterning itself.

Figure 3:
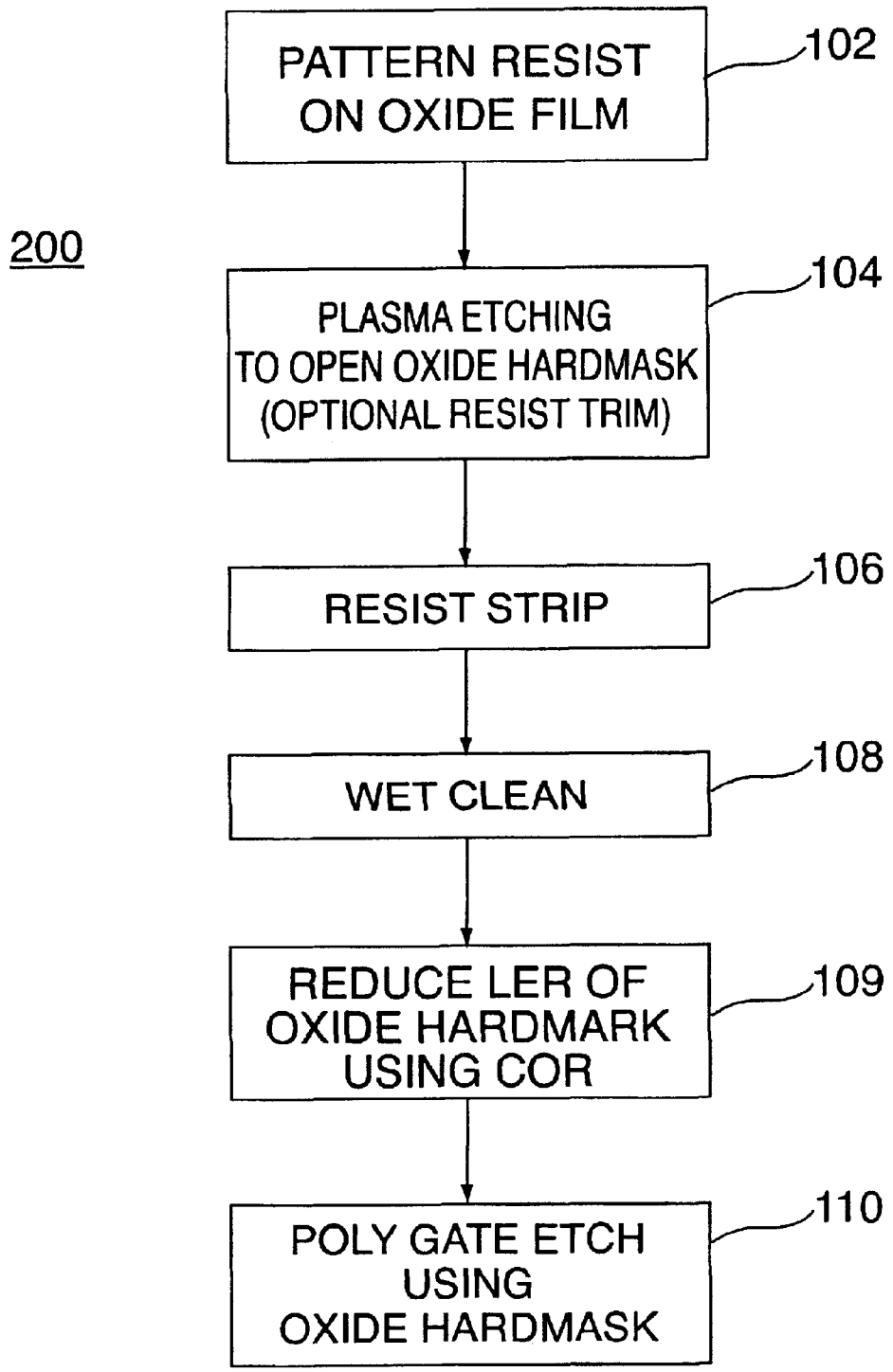
FIG. 3 is a schematic block diagram of an exemplary method for reducing line edge roughness of oxide material using chemical oxide removal, in accordance with an embodiment of the invention.

Thus, as shown in the schematic block diagram of FIG. 3, the present method 200 for reducing the line edge roughness of the oxide hardmask material introduces an additional chemical oxide removal (COR) process, as shown at block 109. For an oxide hardmask, the COR process is governed by the following reaction equations:

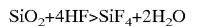

Figure 4:
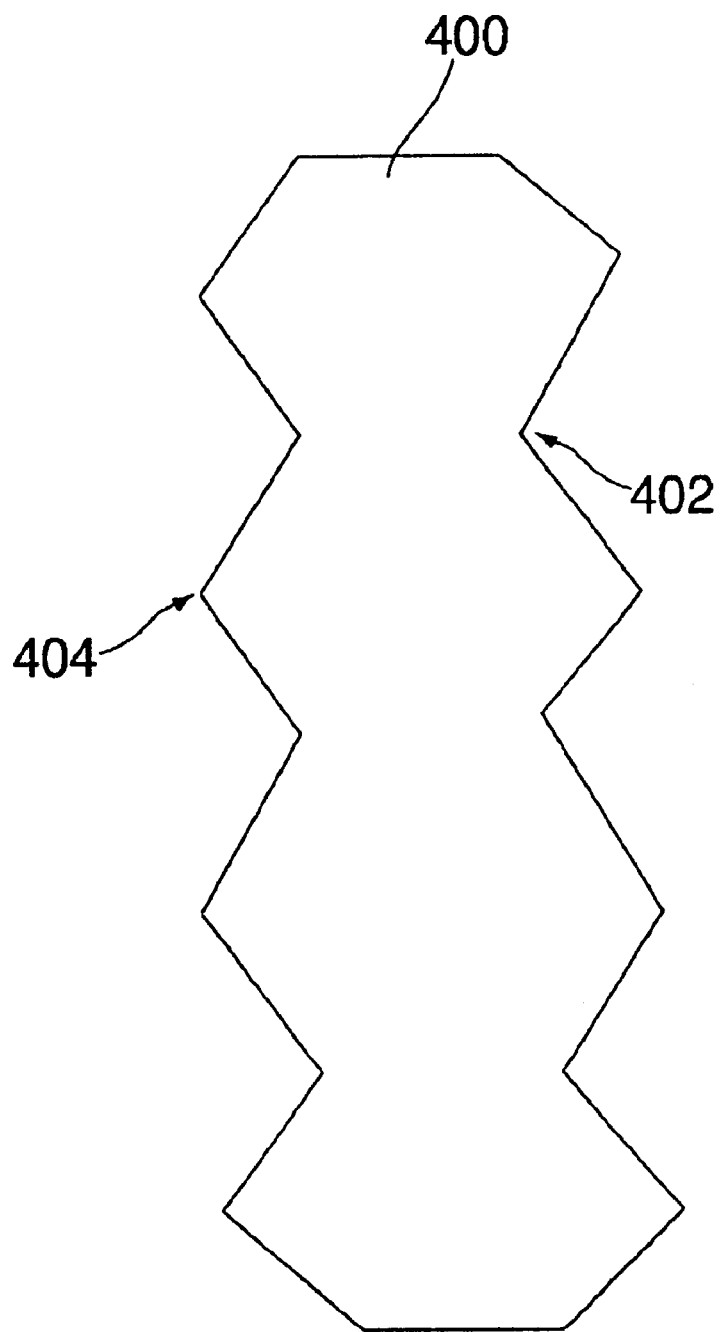
FIG. 4 is a top down view of a portion of a patterned hardmask line following the removal of photoresist.

Due to the differences in the cross sectional surface/volume ratio of inside and outside corners of the hardmask, there is an etch rate differential that results from reaction product buildup. That is to say, concave cross sectional surfaces experience a reduced etching, while convex surfaces experience an enhanced etching relative to the etching of a flat surface. This effect is sufficient to smooth the sidewall profiles of the TEOS (oxide) mask, and thus reduce LER of the line. FIG. 4 is a top down view of a portion of a patterned hardmask line 400 following the removal of photoresist. It will be noted the LER features have been somewhat exaggerated for purposes of illustration. Nonetheless, it can be seen that the rough edges of hardmask line initially include both concave corners 402 and convex corners 404. Although in the exemplary embodiment a TEOS hardmask is used in the patterning and COR steps, it will be appreciated that other oxide (and/or nitride) materials may be used as well.

Figure 5:
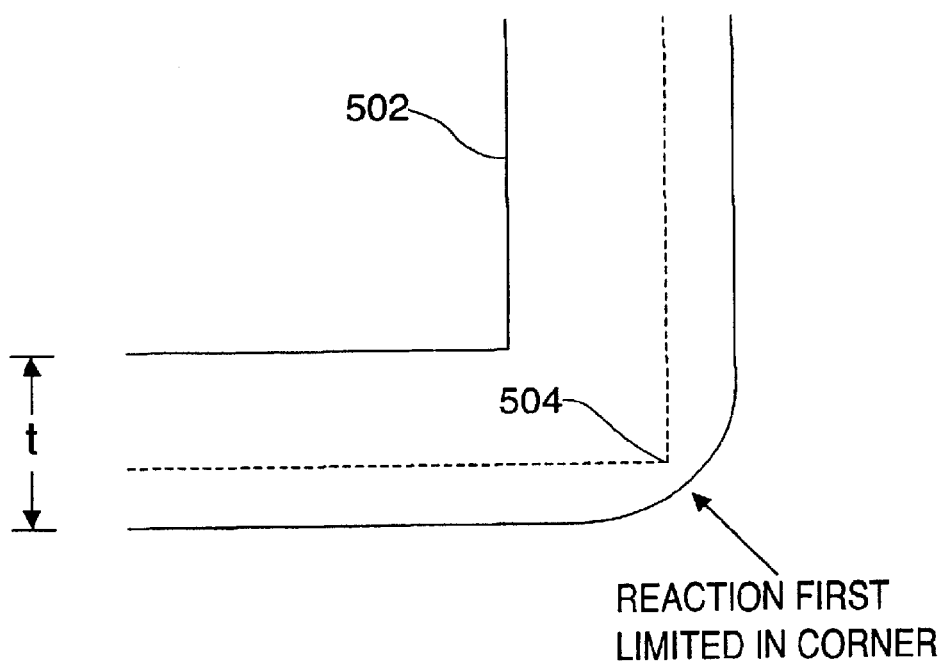
FIG. 5 is a schematic diagram illustrating the effects of the COR process during etching of a concave corner.

The geometric effects of the COR process are perhaps best illustrated by considering the effect of etching in a concave corner. As shown in the diagram of FIG. 5, a solid reaction product (defined by boundary 502 and having a thickness "t") is created from the COR etching of a concave oxide corner 504 originally defined by the dashed line. Because the solid reaction product occupies more volume than the originally etched oxide, and because the reaction product (perpendicularly formed on each surface) overlaps at any point within the distance "t" from the corner 504, there is less etching in the concave (inside) corner of the hardmask line. Thus, the self-limiting thickness of reaction product is reached earlier in this region of reaction product overlap than it is in a region away from a corner. Conversely, the opposite effect occurs on a convex surface, such that greater etching occurs thereon as compared to a planar surface.

Figure 6:
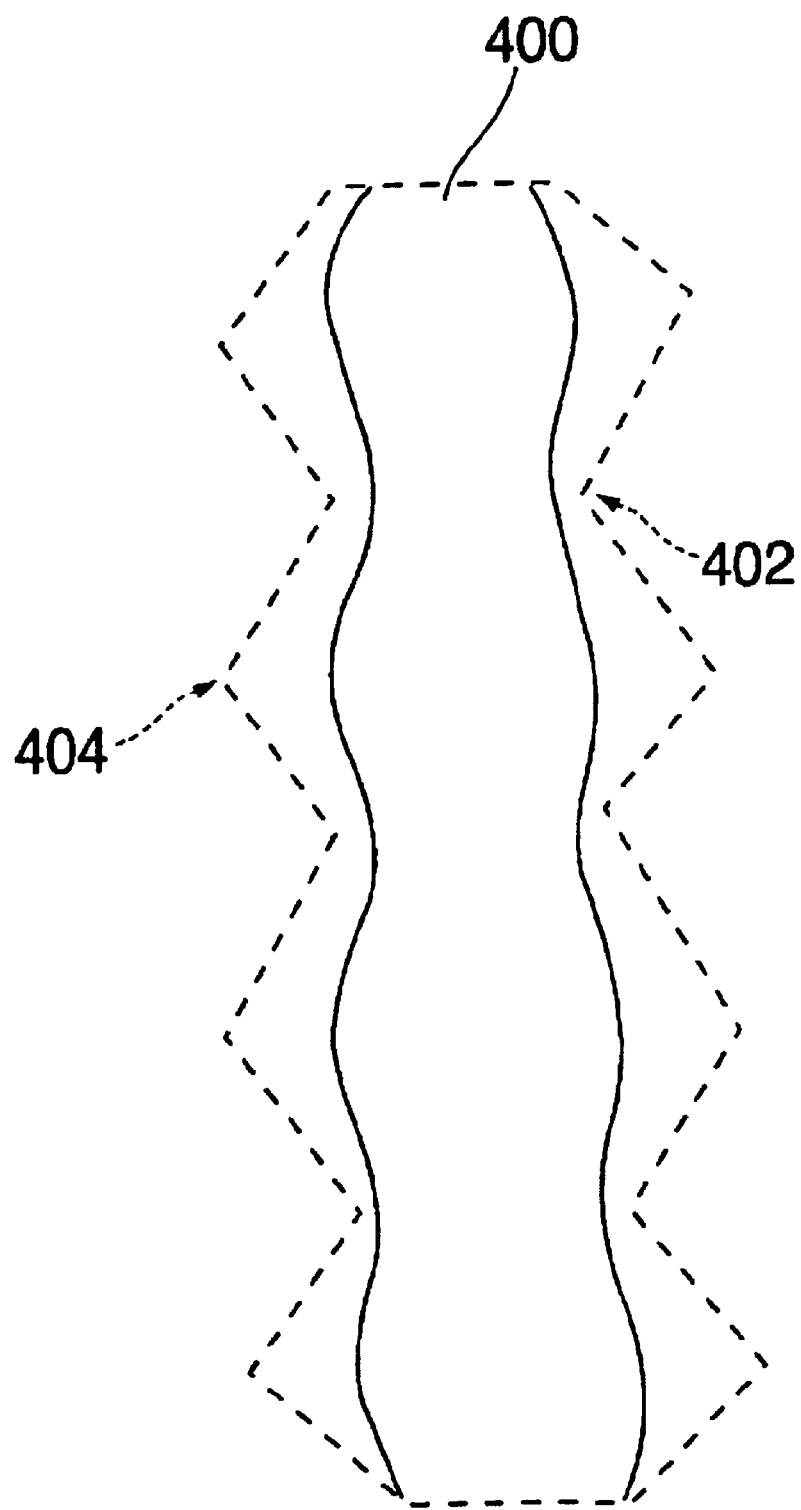
FIG. 6 is a top down view of the patterned hardmask line of FIG. 4 following the COR etching.

FIG. 6 is a top down view of the patterned hardmask line 400 of FIG. 4 following the COR etching. As can be seen, the original LER (indicated by the dashed lines) has been significantly reduced. More particularly, it will be noted that the greatest amount of etching has occurred at the convex corners 404 of the line 400, whereas the least amount of etching has occurred at the concave corners 402 of the line 400.

The above described COR process has a fairly determinable degree of smoothness to be expected when implemented. For example, a cylindrical region of etched hardmask having a radius, r, and a height, h, (which is further capped by an etch resistant layer such that no reaction product is formed thereatop) may be considered for illustrative purposes. If the resulting self-limiting product thickness has a thickness, t, then the volume of product produced during the COR etching process is given by the expression:

$$h\pi[(r+t)^2 - r^2]$$

Since the volume of oxide etched is about ⅓ that of the reaction product volume produced by this process, it is therefore possible to solve for the thickness of oxide etched, o, as given by the expression:

$$\tfrac{1}{3}\{h\pi[(r+t)^2-r^2]\} = h\pi[(r+o)^2-r^2]$$

By solving for o (shown below) and examining the case where the final radius of curvature after etching is about equal to the reaction product thickness will give a feel for the degree of smoothing expected. For example, for a 100 Angstrom (Å) etch on a planar surface, the reaction product thickness is about 300 Å in thickness. From the equation above, about 300 Å will be etched from a feature having an original radius of curvature of 600 Å, thereby resulting in 200 Å of smoothing relative to a planar surface $$o = r \pm \sqrt{\left(r^2 - \frac{t^2}{3} - \frac{2rt}{3}\right)}$$

Figure 7:
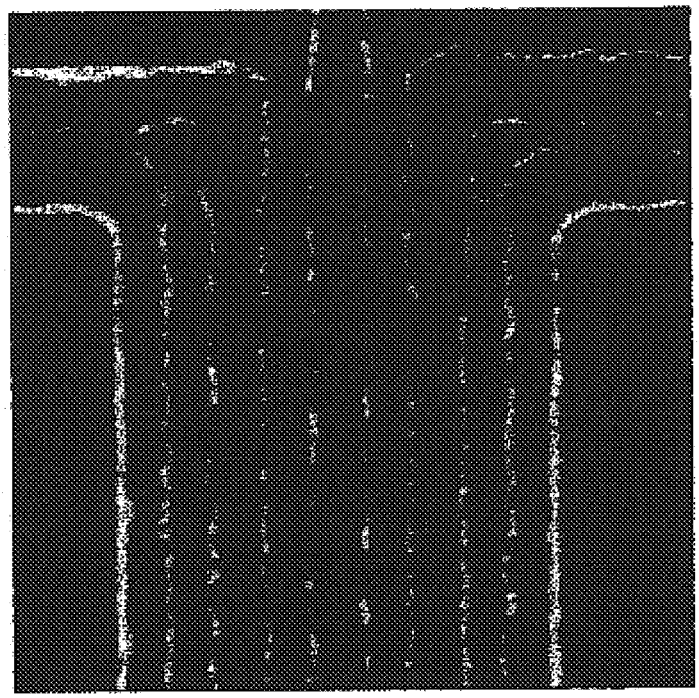
FIG. 7 is a topdown SEM of a resist patterned wafer having an initial line edge roughness.
Figure 8:
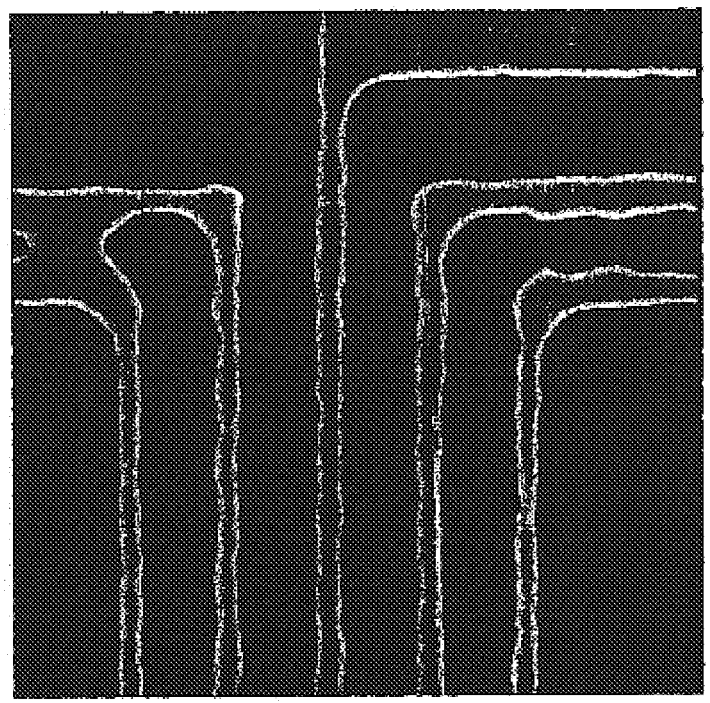
FIG. 8 is a topdown SEM of the wafer of FIG. 7 following the COR etching.

Finally, FIGS. 7 and 8 illustrate a comparison of top-down SEMs between a resist patterned wafer with initial line edge roughness and the same wafer following the chemical oxide removal process. As shown in FIG. 7, the LER of the resist patterned wafer is shown (by Applied Materials Verasem) to have a "Sigma B" of about 18 (wherein a higher number reflects a more severe LER). However, as shown in FIG. 8, following the mask opening and chemical oxide removal (MO+COR) of the present invention, the oxide hardmask is shown to have a reduced Sigma B of 8. Through the use the above described oxide mask smoothing process, there is a demonstrated a 70% reduction in LER from the previous lithography steps, and a 30% reduction in LER from the post MO measurements.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing line edge roughness (LER) of a semiconductor gate structure, the method comprising:
    patterning a photoresist layer formed over an oxide hardmask layer;
    etching said photoresist layer so as to transfer a photoresist pattern to said oxide hardmask layer, said photoresist pattern having an initial LER;
    etching exposed surfaces of said oxide hardmask with a chemical oxide removal (COR) so as to form a reaction product on said exposed surfaces;
    wherein concave portions of said exposed surfaces are etched at a reduced rate with respect to convex portions of said exposed surfaces.

2. The method of claim 1, wherein said COR is implemented by reacting said oxide hardmask with HF and ammonia gasses.

3. The method of claim 2, wherein said oxide hardmask comprises a tetraethyl orthosilicate (TEOS) layer.

4. The method of claim 2, wherein said reaction product further comprises ammonium hexafluorosilicate.

5. A method for forming a gate structure for a semiconductor device, the method comprising:
    patterning a photoresist layer formed over an oxide hardmask layer, said oxide hardmask layer formed over a gate conductor layer;
    etching said photoresist layer so as to transfer a photoresist pattern to said oxide hardmask layer;
    reducing an initial line edge roughness (LER) of said oxide hardmask layer; and
    etching the gate structure using said oxide hardmask layer;
    wherein said reduced initial LER is transferred to the gate structure.

6. The method of claim 5, wherein said reducing an initial LER further comprises etching exposed surfaces of said oxide hardmask with a chemical oxide removal (COR) so as to form a reaction product on said exposed surfaces, wherein concave portions of said exposed surfaces are etched at a reduced rate with respect to convex portions of said exposed surfaces.

7. The method of claim 6, wherein said COR is implemented by reacting said oxide hardmask with HF and ammonia gasses.

8. The method of claim 7, wherein said oxide hardmask comprises a tetraethyl orthosilicate (TEOS) layer.

9. The method of claim 7, wherein said reaction product further comprises ammonium hexafluorosilicate.

10. A method for reducing line edge roughness of an oxide structure, the method comprising:
    etching exposed surfaces of the oxide structure with a chemical oxide removal (COR), wherein said COR is implemented by reacting the oxide material with HF and ammonia gasses so as to form a reaction product on said exposed surfaces;
    wherein concave portions of said exposed surfaces are etched at a reduced rate with respect to convex portions of said exposed surfaces.

11. The method of claim 10, wherein said oxide structure comprises tetraethyl orthosilicate (TEOS).

12. The method of claim 10, wherein said reaction product further comprises ammonium hexafluorosilicate.

* * * * *